United States Patent [19]
Vorenkamp et al.

[11] Patent Number: 5,353,027
[45] Date of Patent: Oct. 4, 1994

[54] MULTISTEP ANALOG-TO-DIGITAL CONVERTER WITH ERROR CORRECTION

[75] Inventors: Pieter P. M. Vorenkamp; Johannes Verdaasdonk; Marcellinus J. M. Pelgrom, all of Eindhoven, Netherlands

[73] Assignee: U.S. Philips Corporation, New York, N.Y.

[21] Appl. No.: 966,208

[22] Filed: Oct. 26, 1992

[30] Foreign Application Priority Data

Nov. 1, 1991 [EP] European Pat. Off. ........ 91202845.3

[51] Int. Cl.[5] .............................................. H03M 1/14
[52] U.S. Cl. ...................................... 341/156; 341/118
[58] Field of Search ............... 341/118, 156, 161, 162, 341/163

[56] References Cited

U.S. PATENT DOCUMENTS

| | | | |
|---|---|---|---|
| 3,967,269 | 6/1976 | Fletcher | 341/118 |
| 5,043,732 | 8/1991 | Robertson et al. | 341/156 |
| 5,083,126 | 1/1992 | Komatsu et al. | 341/156 |

*Primary Examiner*—Marc S. Hoff
*Attorney, Agent, or Firm*—Bernard Franzblau

[57] ABSTRACT

A sub-ranging analog-to-digital converter includes, in cascade, a coarse converter, a digital-to-analog converter, a subtracter circuit and a fine converter. Errors of the coarse converter are detected in the fine converter by means of an overflow detector and an underflow detector which generate an overflow signal (OF) and an underflow signal (UF), respectively. The digital output ($D_A$) of the coarse converter is corrected by first subtracting one LBS in a decoder and then, in response to the overflow and underflow signal, adding thereto zero, one or two LBSs.

5 Claims, 2 Drawing Sheets

MULTISTEP ANALOG-TO-DIGITAL CONVERTER WITH ERROR CORRECTION

BACKGROUND OF THE INVENTION

This invention relates to an analog-to-digital comprising:

a first analog-to-digital converter for converting a first analog signal to a first digital signal which denotes the sub-range of a plurality of sub-ranges in which the first analog signal is situated, a digital-to-analog converter converting the first digital signal to a second analog signal, a second analog-to-digital converter for convening a difference signal indicative of the difference between the first and second analog signals to a second digital signal, detection means for detecting an overflow and an underflow if the difference signal is situated above and below respectively, the sub-range denoted by the first digital signal, and correction means for correcting the first digital signal in response to the detection of the overflow and underflow.

An analog-to-digital converter (ADC) of this type is known from U.S. Pat. No. 3,967,269 and is of a type known as a multistep or sub-ranging ADC. In this type of ADC the conversion to the desired digital output signal is performed in two or more steps while in each step a separate ADC converts an ever smaller subrange of the overall range of the analog input signal to be convened. In the prior art ADC, a coarse conversion of the first analog signal to be convened to the first digital signal is effected in the first ADC having an M-bit resolution. The first digital signal is reconverted to a second analog signal in the digital-to-analog converter. The difference between the second and first analog signals is then fine-convened to the second digital signal by means of the second ADC having an (N-M)-bit resolution. The M bits of the first and the (N-M) bits of the second digital signal are combined to provide the desired N-bit digital output signal, the bits of the first digital signal forming the most significant bits and the bits of the second digital signal forming the least significant bits of the output signal.

As a result of errors in the system the difference signal may come to be outside the analog sub-range determined by the first ADC. Such errors may be caused by, for example, decision errors in the first ADC. The prior art ADC comprises detection means signalling by means of an overflow signal or an underflow signal whether the difference signal has come to be above or below the sub-range as a result of an error. In the prior art ADC the error is corrected in the following manner. In the case of an overflow the second ADC produces a second digital signal which has a value reduced by a number equal to the maximum number of sub-ranges the second ADC is capable of measuring (fold-back) and in a digital arithmetic unit one bit is subtracted from the first digital signal. In the case of an underflow the second ADC produces a second digital signal which has a value increased by afore-mentioned number and in the digital arithmetic unit one bit is added to the first digital signal. If neither an underflow nor an overflow is detected, the difference signal lies within the range denoted by the first digital signal. In that case the second digital signal is produced by the second ADC unaltered, and no arithmetic operation is performed on the first digital signal by the digital arithmetic unit.

A disadvantage of this prior art error correction method is that the digital arithmetic unit has to be capable of both adding one bit to the first digital signal and subtracting one bit therefrom. The realisation of an arithmetic unit which is capable of performing both of these operations is complicated.

SUMMARY OF THE INVENTION

It is an object of the invention to provide a multistep ADC with an error correction that is simpler to implement.

An analog-to-digital converter of the type mentioned in the opening a paragraph is, according to the invention characterized, in that the correction means comprise:

means for generating a third digital signal which represents a value that is one least significant bit lower than the value represented by the first digital signal, adder means for adding to the third digital signal zero and two least significant bits respectively, in the case of a detection of the underflow and overflow respectively, and one least significant bit in the other case, i.e., where neither an underflow or an overflow is detected.

The third digital signal always has a value one least significant bit lower than the first digital signal. For the error correction a mere addition by zero, one or two least significant bits to the third digital signal is now sufficient. When underflow is detected, nothing is added to the third digital signal, when overflow is detected, two bits are added and if the difference signal lies within the range, one bit is added to the third digital signal. The result of these operations on the first digital signal has the same effect as that of a one-bit adding-/subtracting operation according to the state of the art.

BRIEF DESCRIPTION OF THE DRAWING

The invention will now be further explained with reference to the appended drawing, in which.

DESCRIPTION OF THE PREFERRED EMBODIMENTS

Figure 1:
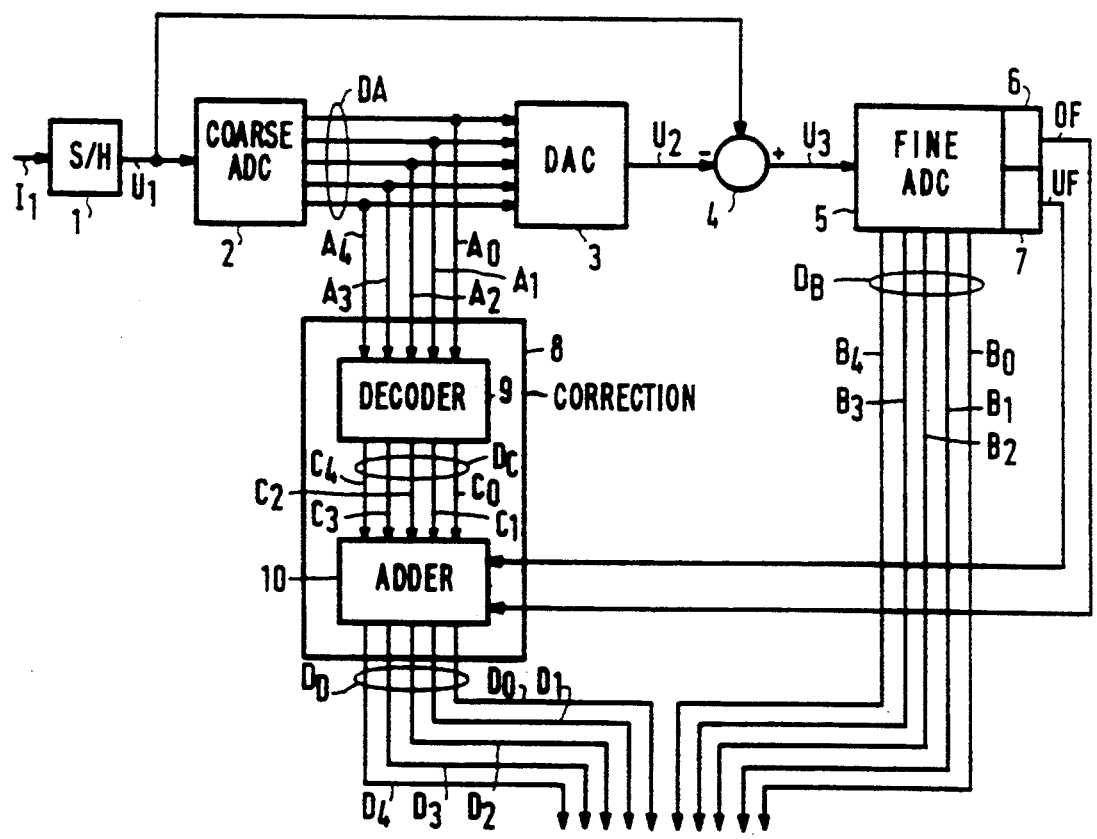
FIG. 1 shows a block diagram of an analog-to-digital converter according to the invention.

FIG. 1 shows a two-step sub-ranging analog-to-digital converter (ADC) with error correction according to the invention. An analog signal $I_1$ to be converted is applied via a sample-and-hold circuit 1 as a sampled analog signal $U_1$ to a first ADC 2. This ADC 2 performs a coarse conversion of the analog signal $U_1$ and produces a first digital signal $D_A$ with a resolution selected to be, for example, 5 bits, of which the least significant bit (LSB) is referenced $A_0$ and the most significant bit (MSB) is referenced $A_4$. The digital signal $D_A$ is reconverted in a digital-to-analog converter (DAC) 3 to a second analog signal $U_2$ which marks the beginning of the analog sub-range of the input signal $U_1$ determined by the coarse ADC 2. Coarse ADC 2 in this example divides the overall range of the input signal $U_1$ into $2^5=32$ sub-ranges. In a difference stage 4 the second analog signal $U_2$ is subtracted from the first analog signal $U_1$. The conversion in coarse ADC 2 takes some time. The sample-and-hold circuit 1 insures that the analog signals applied to the difference stage 4 and to the coarse ADC 2 have the same instantaneous value. The difference signal $U_3$ between the analog signals $U_1$ and $U_2$ is applied to a second ADC 5 and converted to a second digital signal $D_B$ likewise containing 5 bits, of which the MSB is referenced $B_4$ and the LSB is referenced $B_0$. ADC 5 performs a fine conversion of the difference signal $U_3$ and divides the sub-range selected by coarse ADC 2 into 32 smaller sub-ranges. In this fashion a total of $32 \times 32 = 1024$ ($2^{10}$) sub-ranges are distinguished in the amplitude range of the analog signal $U_1$. The ADCs 2 and 5 may be of any known type, for example, flash converters comprising a resistance ladder and comparators.

When an errorless coarse conversion is performed by coarse ADC 2, the difference signal $U_3$ will always be situated in the same analog signal range that is covered by fine ADC 5. However, if through unknown causes coarse ADC 2 produces a digital signal $D_A$ that does not correspond to the actual sub-range in which the analog signal $U_1$ is situated, the difference signal $U_3$ will fall outside the expected range and the digital output signal $D_B$ of fine ADC 5 will present an incorrect value. For this matter, the digital signal $D_B$ cannot be smaller than 00000 and cannot be greater than 11111. To eliminate this situation, fine ADC 5 comprises an overflow detector 6 which produces an overflow bit OF that signals, for example, by means of OF=1, when the difference signal $U_3$ is greater than permitted, and includes an underflow detector 7 which produces an underflow bit UF that signals, by means of UF=1, that the difference signal is smaller than permitted. The OF and UF bits may be generated in various ways, for example, by permitting fine ADC 5 to convert twice as large a signal range as is strictly necessary. Internally, the fine ADC 5 then operates with a resolution of one bit more, in this case 6 bits.

Figure 2:
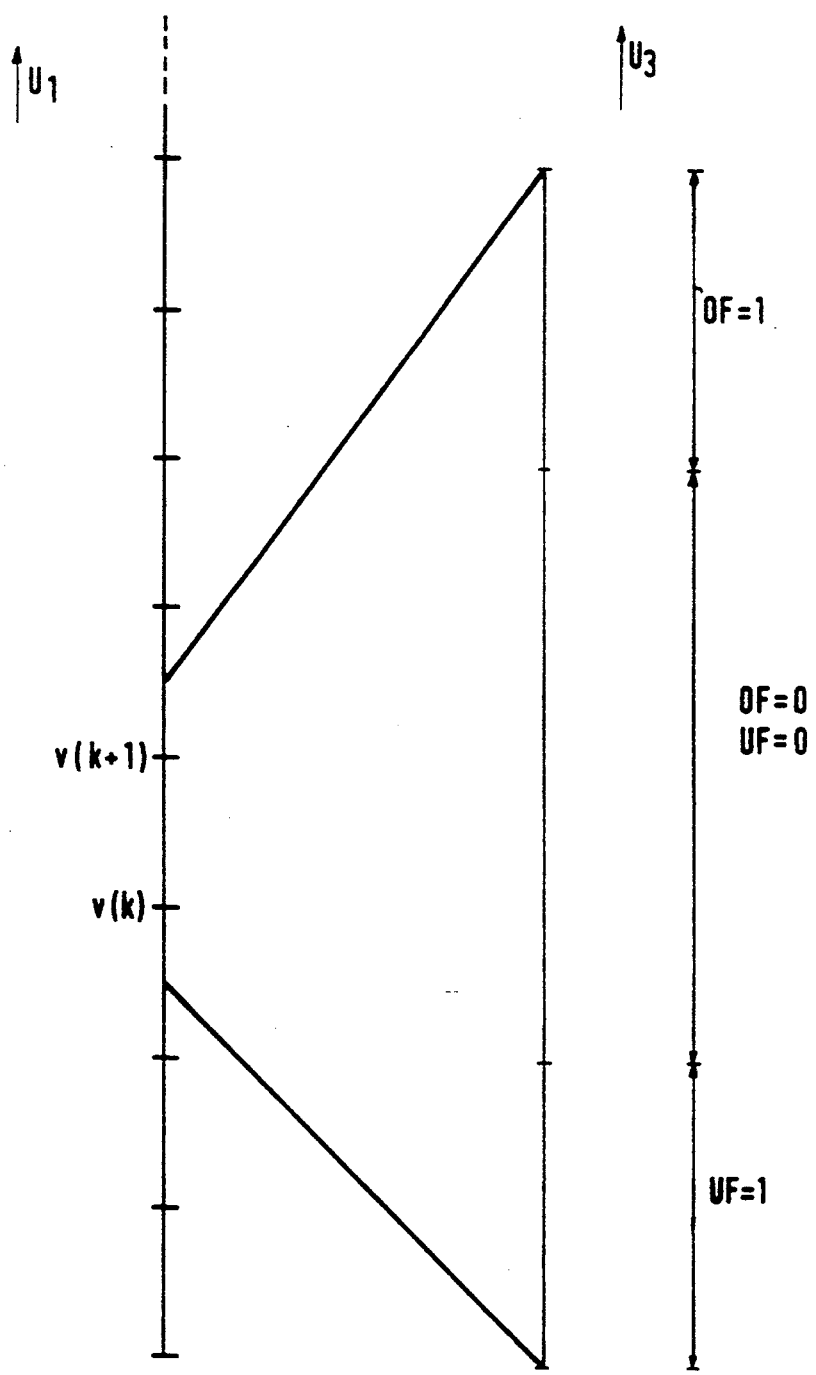
FIG. 2 shows a diagram in explanation of the operation of the analog-to-digital converter shown in FIG. 1.

FIG. 2 shows how the range of the analog signal $U_1$ is divided into subranges by the coarse ADC 2. Only a few sub-ranges of all the 32 have been shown. The signal range $U_3$ of fine ADC 5 is twice as large as the sub-range $V(K+1)-V(K)$ of the coarse ADC 2 determined by two successive reference values, and overlaps this subrange by equally large portions on either side. The operation of the fine ADC 5 may be as described in the aforementioned U.S. Pat. No. 3,967,269 and hereby incorporated by reference. If the analog signal $U_1$ exceeds $V(K+1)$, there is an overflow situation and the overflow detector 6 generates an overflow bit OF=1. The 6-bit internal number is reduced by $2^5+2^4=48$ (fold-back) and the 5 least significant bits of the resulting number are presented on the output of the fine ADC 5. If the analog signal $U_1$ is smaller than $V(K)$, there is an underflow situation and the underflow detector 7 generates an underflow bit UF=1. The 6-bit internal number is now increased by $2^4=16$ and only the 5 least significant bits of the resulting number are presented on the output of the fine ADC 5. If the analog signal $U_1$ lies between the reference values $V(K+1)$ and $V(K)$, both the overflow bit OF=0 and the underflow bit UF=0. The difference signal $U_3$ is then in range. The 6-bit internal number is reduced by $2^4=16$ and the 5 least significant bits thereof are presented on the output of the fine ADC 5.

The correction of the digital signal $D_A$ of the coarse ADC 2 is effected in the correction means 8 in response to the overflow bit OF and underflow bit UF. In a decoder 9 the digital signal $D_A$ is first decoded to a third digital signal $D_C$ with the bits $C_4-C_0$ and having a value that is one LSB lower than the value of the digital signal $D_A$. Subsequently, the digital signal $D_C$ is processed in an adder 10 and the result of this operation becomes available on an output as a digital signal $D_D$ with the bits $D_4-D_0$. In adder 10 nothing is added to the digital signal $D_C$ if the underflow bit UF=1; 1 LSB is added if both the overflow bit OF=0 and the underflow bit UF=0 and 2 LSBs are added if the overflow bit OF=1. Thus, a detected incorrect value of the digital signal $D_A$ from the coarse ADC 2 is corrected in the correction means 8 by way of arithmetical operations both of which are an addition and are therefore relatively simple to implement.

The decoder 9 may form a part of the coarse ADC 2 which produces in that case both the digital signal $D_A$ and the digital signal $D_C$. This is especially advantageous if ADC 2 operates with an internal digital code, such as, for example, the thermometer code which differs from the digital code presented on the output terminals. ADC 2 then internally comprises a decoder which converts the internal thermometer code to the desired digital output signal code. It is then relatively simple to modify this decoder, which is present anyway, and give it a twofold function, so that in addition to the digital signal $D_A$ also the digital signal $D_C$ is produced.

A further possibility is that DAC 3 is arranged for receiving a digital signal having a code equal to the internal code, for example, again the thermometer code of ADC 2. In that case no decoding of the internal thermometer code to the desired output signal code is necessary in ADC 2. The decoder in ADC 2 then only performs the single function of decoder 9.

Furthermore, it is also possible for the adder 10 to be incorporated in the coarse ADC 2 and for this ADC to have two outputs: one for the normal digital signal $D_A$ and one for the digital signal $D_D$.

The bits of the digital signals $D_D$ and $D_B$ together form the digital output signal of the two-step ADC. The 5 bits $D_4-D_0$ of $D_D$ form the most significant bits and the 5 bits $B_4-B_0$ of $D_B$ form the least significant bits of the 10-bit output signal.

Figure 3:
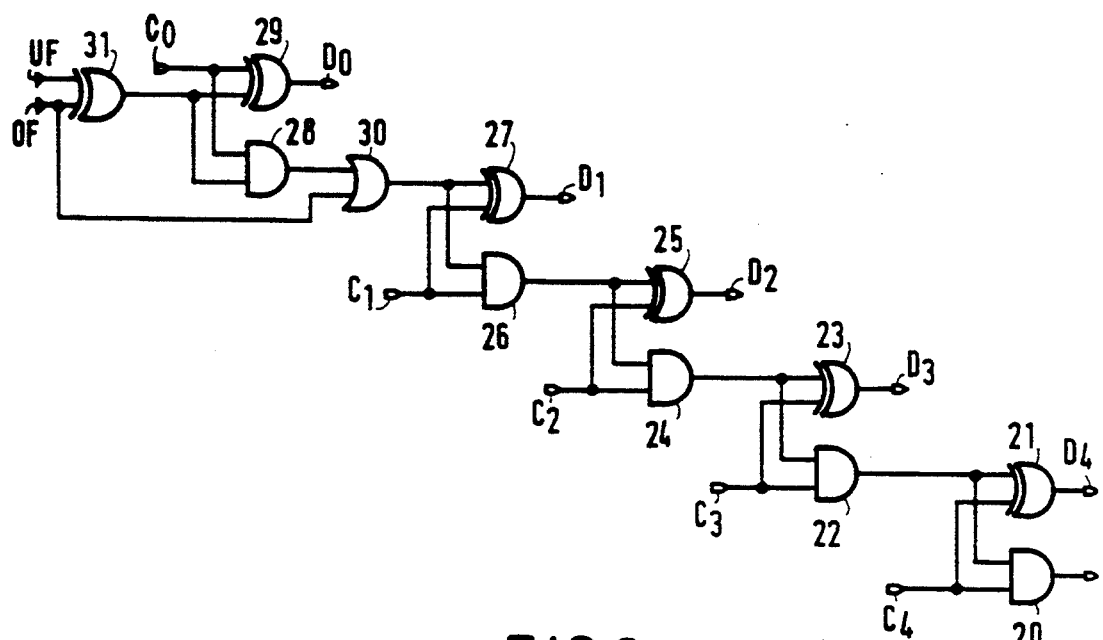
FIG. 3 shows a circuit diagram of a correction circuit to be used in the analog-to-digital converter shown in FIG. 1.

FIG. 3 shows a possible realisation of the adder 10. Bit $C_4$ of the digital signal $D_C$ is fed to an input of both the dual input AND gate 20 and a dual input X-OR gate 21. Bits $C_3, C_2, C_1$ and $C_0$ are similarly fed to the respective AND gate 22 and X-OR gate 23, AND gate 24 and X-OR gate 25, AND gate 26 and X-OR gate 27, and AND gate 28 and X-OR gate 29. The remaining inputs of the gates 20 and 21 are connected to the output of the gate 22. The remaining inputs of the gates 22 and 23 and the gates 24 and 25 are similarly connected to the outputs of the respective gates 24 and 26. The remaining inputs of the gates 26 and 27 are connected to the output of a dual-input OR gate 30, whose one input is connected to the output of gate 28 and whose other input is connected to the overflow bit OF. The overflow bit OF and the underflow bit UF are fed to inputs of a dual input X-OR gate 31 whose output is connected to the remaining inputs of the gates 28 and 29. On the outputs of the gates 21, 23, 25, 27 and 29 are available the bits $D_4$, $D_3$, $D_2$, $D_1$ and $D_0$. The output of gate 20 presents a carry-bit.

The invention is not restricted to the depicted two times 5-bit two-step analog-to-digital converter. The error correction may also be used in multistep converters having any desired resolution.

What is claimed is:

1. Analog-to-digital converter comprising:
   a first analog-to-digital converter for converting a first analog signal ($U_1$) to a first digital signal ($D_A$) which denotes from a plurality of sub-ranges a sub-range in which the first analog signal is situated,
   a digital-to-analog converter for converting the first digital signal to a second analog signal ($U_2$),
   a second analog-to-digital converter (5) for converting a difference signal ($U_3$) indicative of the difference between the first and second analog signals ($U_1$, $U_2$) to a second digital signal ($D_B$),
   detection means for detecting an overflow (OF) and an underflow (UF) if the difference signal is situated above and below respectively, the sub-range denoted by the first digital signal,
   correction means for correcting the first digital signal ($D_A$) in response to the detection of the overflow (OF) and underflow (UF), wherein the correction means comprise:
   means for generating a third digital signal ($D_C$) which represents a value that is one least significant bit less than the value represented by the first digital signal ($D_A$),
   adder means for adding to the third digital signal ($D_C$) zero and two least significant bits respectively, in the case of a detection of the underflow (UF) and overflow (OF) respectively, and one least significant bit in the case of detection of neither an underflow or an overflow.

2. Analog-to-digital converter as claimed in claim 1, wherein the first analog-to-digital converter comprises a decoder for decoding an internal digital signal having an internal code to the first digital signal ($D_A$) having an external code which differs from the internal code, and in that the generating means for generating the third digital signal are included in the decoder.

3. Analog-to-digital converter as claimed in claim 2, wherein the external code of the first digital signal ($D_A$) is equal to the internal code of the first analog-to-digital converter and the digital-to-analog converter is arranged to receive a digital input signal having the internal code.

4. An analog-to-digital converter as claimed in claim 1 further comprising, means responsive to the first analog signal and to the second analog signal for deriving said difference signal ($U_3$).

5. An analog-to-digital converter as claimed in claim 4 wherein outputs of the detection means are coupled to control input means of the adder means and output means of the adder means supply the most significant bits of the digital output signal and output means of the second analog-to-digital converter supply the least significant bits of the digital output signal.

* * * * *

UNITED STATES PATENT AND TRADEMARK OFFICE
CERTIFICATE OF CORRECTION

PATENT NO. : 5,353,027
DATED : October 4, 1994
INVENTOR(S) : Pieter P. M. Vorenkamp, et al.

It is certified that error appears in the above-indentified patent and that said Letters Patent is hereby corrected as shown below:

Title page, item [75] Abstract, col. 2, line 9, change "LBS" to --LSB--;
line 11, change "LBSs " to --LSBs--.

Column 5, claim 1, line 9, delete "(5)".
Column 6, claim 2, line 6, delete "generating" (first occurrence).

Signed and Sealed this

Thirty-first Day of January, 1995

Attest:

BRUCE LEHMAN

Attesting Officer     Commissioner of Patents and Trademarks